US011417568B2

(12) United States Patent
Lei et al.

(10) Patent No.: US 11,417,568 B2
(45) Date of Patent: Aug. 16, 2022

(54) METHODS FOR SELECTIVE DEPOSITION OF TUNGSTEN ATOP A DIELECTRIC LAYER FOR BOTTOM UP GAPFILL

(71) Applicant: APPLIED MATERIALS, INC., Santa Clara, CA (US)

(72) Inventors: Wei Lei, Campbell, CA (US); Yi Xu, San Jose, CA (US); Yu Lei, San Jose, CA (US); Tae Hong Ha, San Jose, CA (US); Raymond Hung, Palo Alto, CA (US); Shirish A. Pethe, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 384 days.

(21) Appl. No.: 16/845,749

(22) Filed: Apr. 10, 2020

(65) Prior Publication Data

US 2021/0320034 A1 Oct. 14, 2021

(51) Int. Cl.
*H01L 21/768* (2006.01)
*H01L 21/3213* (2006.01)
*H01L 21/285* (2006.01)

(52) U.S. Cl.
CPC .... *H01L 21/76883* (2013.01); *H01L 21/2855* (2013.01); *H01L 21/32136* (2013.01)

(58) Field of Classification Search
None
See application file for complete search history.

(56) References Cited

U.S. PATENT DOCUMENTS

| 9,062,372 | B2 | 6/2015 | Gopalraja et al. |
| 9,362,130 | B2 | 6/2016 | Ingle et al. |
| 9,899,258 | B1* | 2/2018 | Wu ............... H01L 21/76847 |
| 2002/0081850 | A1 | 6/2002 | Kobayashi et al. |
| 2008/0237869 | A1 | 10/2008 | Li et al. |

(Continued)

OTHER PUBLICATIONS

International Search Report for PCT/US2021/026446, dated Jul. 30, 2021.

*Primary Examiner* — Bradley Smith
(74) *Attorney, Agent, or Firm* — Moser Taboada

(57) ABSTRACT

Methods and apparatus for selectively depositing a tungsten layer atop a dielectric surface. In embodiments the method includes: depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; oxidizing a top surface of the tungsten layer to form a first oxidized tungsten portion atop the substrate field, a second oxidized tungsten portion atop the side wall, and a third oxidized tungsten portion atop the dielectric bottom surface; removing the first oxidized tungsten portion, the second oxidized tungsten portion and the third oxidized tungsten portion, wherein the second tungsten portion is completely removed from the sidewall; and passivating or completely removing the first tungsten portion from the substrate field.

20 Claims, 9 Drawing Sheets

(56) References Cited

U.S. PATENT DOCUMENTS

| | | |
|---|---|---|
| 2009/0008531 A1* | 1/2009 | Caubet .............. H01L 31/02164 |
| | | 257/E27.142 |
| 2012/0009785 A1 | 1/2012 | Chandrashekar et al. |
| 2014/0273451 A1 | 9/2014 | Wang et al. |
| 2015/0056803 A1* | 2/2015 | Chandrashekar ............................ |
| | | H01L 21/76877 |
| | | 438/666 |
| 2016/0043035 A1 | 2/2016 | Lin et al. |
| 2019/0189509 A1 | 6/2019 | Bertrams et al. |

* cited by examiner

100

102 — DEPOSITING A TUNGSTEN LAYER VIA A PHYSICAL VAPOR DEPOSITION (PVD) PROCESS ATOP A SUBSTRATE FIELD AND ATOP A SIDEWALL AND A DIELECTRIC BOTTOM SURFACE OF A FEATURE DISPOSED IN A SUBSTRATE TO FORM A FIRST TUNGSTEN PORTION HAVING A FIRST THICKNESS ATOP THE SUBSTRATE FIELD, A SECOND TUNGSTEN PORTION HAVING A SECOND THICKNESS ATOP THE SIDEWALL, AND A THIRD TUNGSTEN PORTION HAVING A THIRD THICKNESS ATOP THE DIELECTRIC BOTTOM SURFACE, WHEREIN THE SECOND THICKNESS IS LESS THAN THE FIRST THICKNESS AND THIRD THICKNESS

104 — OXIDISING A TOP SURFACE OF THE TUNGSTEN LAYER TO FORM A FIRST OXIDIZED TUNGSTEN PORTION ATOP THE SUBSTRATE FIELD, A SECOND OXIDIZED TUNGSTEN PORTION ATOP THE SIDE WALL, AND A THIRD OXIDIZED TUNGSTEN PORTION ATOP THE DIELECTRIC BOTTOM SURFACE

106 — REMOVING THE FIRST OXIDIZED TUNGSTEN PORTION, THE SECOND OXIDIZED TUNGSTEN PORTION AND THE THIRD OXIDIZED TUNGSTEN PORTION, WHEREIN THE ECOND TUNGSTEN PORTION IS COMPLETELY REMOVED FROM THE SIDEWALL

108 — PASSIVATING OR COMPLETELY REMOVING THE FIRST TUNGSTEN PORTION FROM THE SUBSTRATE FIELD

FIG. 1

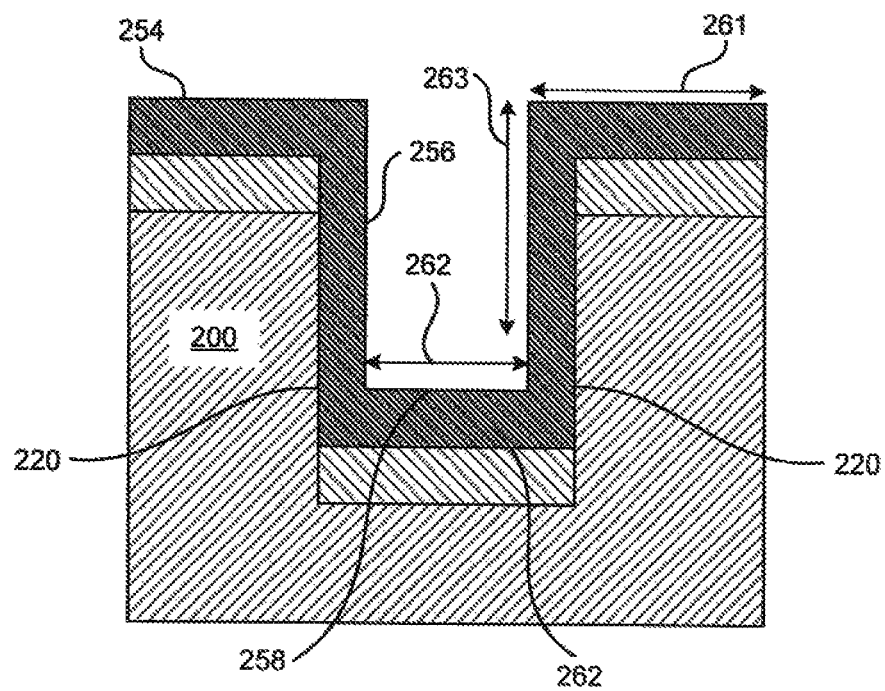
FIG. 2C
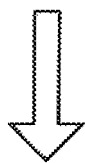
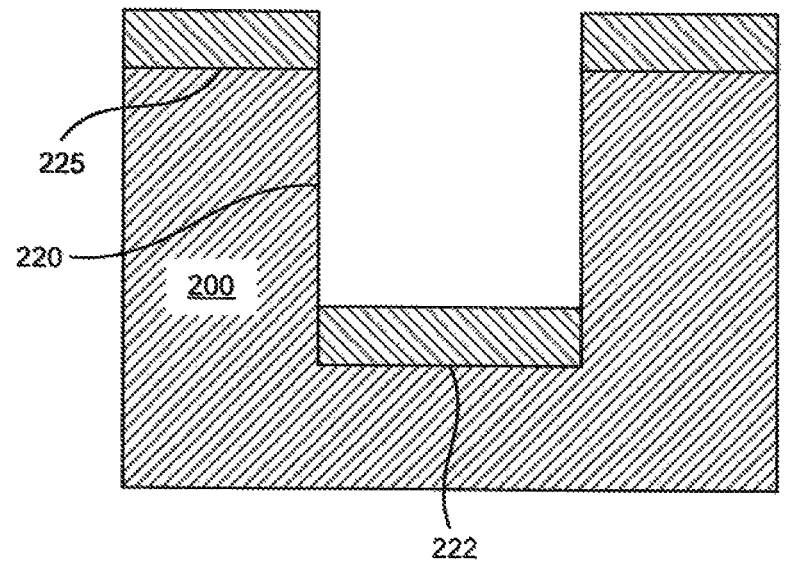
FIG. 2D

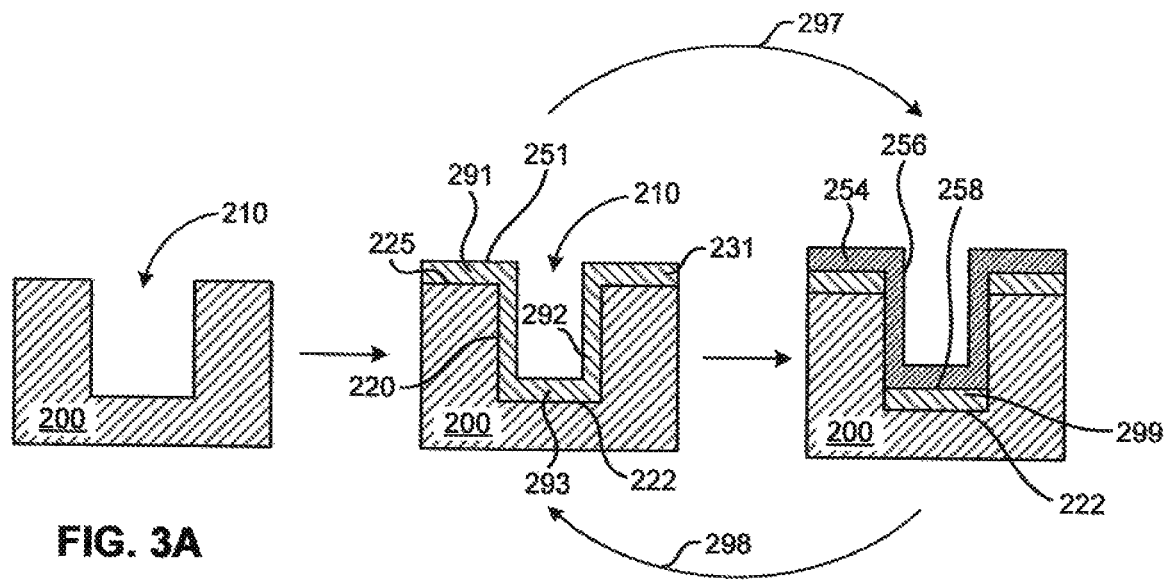
FIG. 3A  FIG. 3B  FIG. 3C
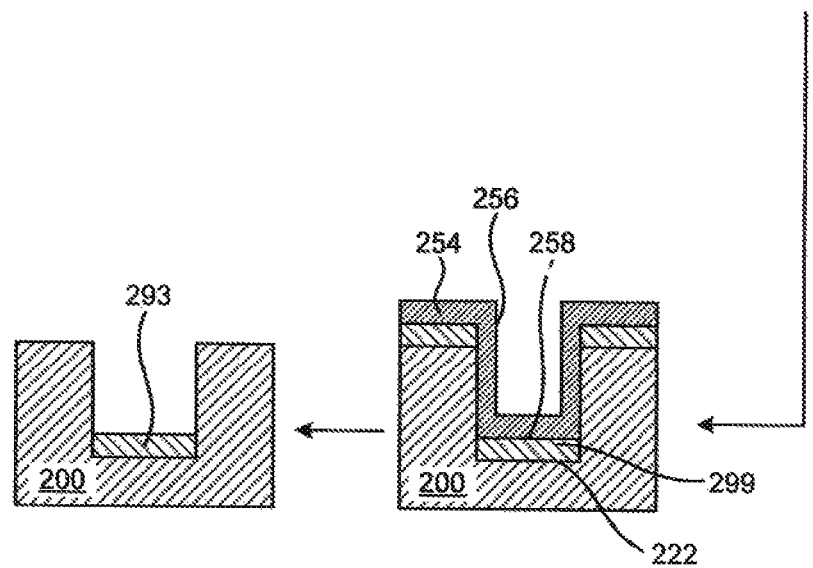
FIG. 3E  FIG. 3D

700

┌─────────────────────────────────────────────────┐
│ DEPOSITING A TUNGSTEN LAYER VIA A PHYSICAL VAPOR │
│ DEPOSITION (PVD) PROCESS ATOP A SUBSTRATE FIELD AND ATOP │
│ A SIDEWALL AND A DIELECTRIC BOTTOM SURFACE OF A │
│ FEATURE DISPOSED IN A SUBSTRATE TO FORM A FIRST │
│ TUNGSTEN PORTION HAVING A FIRST THICKNESS ATOP THE │
│ SUBSTRATE FIELD, A SECOND TUNGSTEN PORTION HAVING A │─ 702
│ SECOND THICKNESS ATOP THE SIDEWALL, AND A THIRD │
│ TUNGSTEN PORTION HAVING A THIRD THICKNESS ATOP THE │
│ DIELECTRIC BOTTOM SURFACE, WHEREIN THE SECOND │
│ THICKNESS IS LESS THAN THE FIRST THICKNESS AND THIRD │
│ THICKNESS │
└─────────────────────────────────────────────────┘
                        ↓
┌─────────────────────────────────────────────────┐
│ REMOVING THE FIRST TUNGSTEN PORTION, AND THE SECOND │
│ TUNGSTEN PORTION, WHEREIN THE FIRST TUNGSTEN PORTION │
│ AND SECOND TUNGSTEN PORTION ARE COMPLETELY REMOVED │─ 704
│ FROM THE SUBSTRATE, AND WHEREIN THE THIRD TUNGSTEN │
│ PORTION REMAINS ATOP THE DIELECTRIC BOTTOM SURFACE │
└─────────────────────────────────────────────────┘

FIGURE 7

METHODS FOR SELECTIVE DEPOSITION OF TUNGSTEN ATOP A DIELECTRIC LAYER FOR BOTTOM UP GAPFILL

FIELD

Embodiments of the present disclosure generally relate to methods for selective deposition of tungsten atop a dielectric layer.

BACKGROUND

Semiconductor device geometries continue to decrease in size such that semiconductor fabrication equipment produces devices with less than 30 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to width becomes high enough to make it challenging to fill the gap with material. The depositing material is prone to clog at the top before the gap completely fills, producing a void or seam in the middle of the gap.

The gap fill deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber a tungsten film (the bulk layer) is deposited on a nucleation layer. The inventors have found that trenches may problematically promote the formation of trapped pockets within the gap-fill tungsten despite the conformal nature of the CVD bulk layer tungsten deposition.

Physical vapor deposition (PVD) techniques are known but the inventors have observed gap-fill problems remain as the thickness of the PVD deposited tungsten film may vary depending upon whether the film is deposited on the substrate field, sidewall of the feature, or bottom of the feature. The PVD tungsten deposition typically deposits a non-selective blanket layer of material not useful as a substrate for continued selective deposition. The inventors have also observed PVD deposition of tungsten is problematic atop non-conductive surfaces such as dielectric material.

Selective deposition processes can advantageously reduce the number of steps and cost involved in conventional lithography while keeping up with the pace of device dimension shrinkage. Selective deposition in a tungsten integration scheme is of high potential value as tungsten is an important material widely used to reduce contact resistance of transistors connections. The inventors have observed poor selectivity of tungsten materials between silicon and dielectrics such as silicon nitride and silicon oxide raise a severe challenge in maximizing metallic feature fill, e.g., poor selectivity may result in tungsten material deposition on the sidewalls and bottom of a high aspect ratio feature and limit the ability to fill the feature with a desired metallic material. Because the poor selectivity may promote non-uniformity of the substrate, highly selective deposition of tungsten material is needed to reduce contact resistance and maximize volume of feature fill material.

Accordingly, the inventors have developed improved methods for selective deposition of tungsten materials towards dielectrics such as silicon oxide, silicon nitride and tetraethyl orthosilicate (TEOS).

SUMMARY

Methods and apparatus for selectively depositing a tungsten layer atop a dielectric surface are provided herein. In some embodiments, a method of selectively depositing a tungsten layer atop a dielectric surface, includes: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the side wall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field. In embodiments, the first oxidized tungsten portion atop the substrate field is thicker than the third oxidized tungsten portion atop the dielectric bottom surface. In embodiments, maintaining the third tungsten portion, or a portion of the third tungsten portion atop the dielectric bottom surface facilitates selective tungsten growth.

In some embodiments, a method of selectively depositing a tungsten layer atop a dielectric bottom surface, includes: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten portion, wherein the first tungsten portion and second tungsten portion are completely removed from the substrate, and wherein the third tungsten portion remains atop the dielectric bottom surface. In embodiments, the first thickness is less than the third thickness.

In some embodiments, the present disclosure relates to a non-transitory computer readable medium having instructions stored thereon that, when executed, cause a reaction chamber to perform selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the side wall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field.

In some embodiments, the present disclosure relates to a non-transitory computer readable medium having instructions stored thereon that, when executed, cause a reaction chamber to perform selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten portion, wherein the first tungsten portion and second tungsten portion are completely removed from the substrate, and wherein the third tungsten portion remains atop the dielectric bottom surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 depicts a flow diagram of a method for selectively depositing a tungsten layer atop a dielectric surface in accordance with embodiments of the present disclosure.

FIGS. 2A-2E respectively depict stages of selectively depositing a tungsten layer atop a dielectric surface in accordance with embodiments such as FIG. 1 of the present disclosure.

FIGS. 3A-3E respectively depict stages of selectively depositing a tungsten layer atop a dielectric surface in accordance with embodiments of the present disclosure.

FIG. 7 depicts a flow diagram of a method for selectively depositing a tungsten layer atop a dielectric surface in accordance with embodiments of the present disclosure.

Figure 2A:
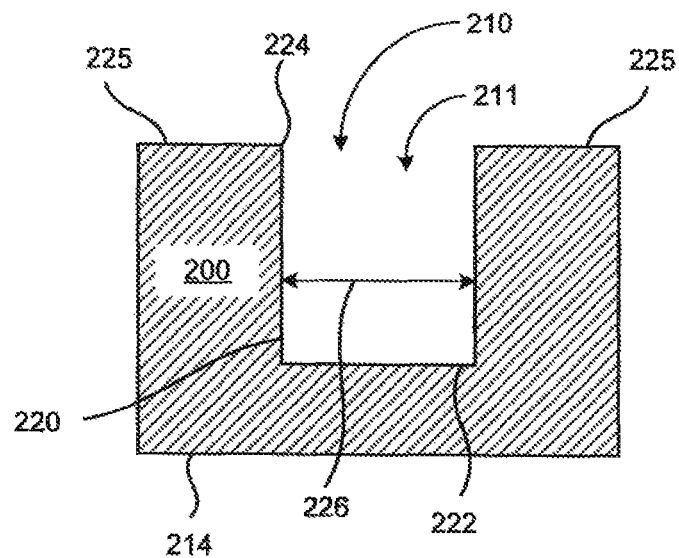

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The inventors have observed that tungsten deposited within a feature may advantageously be selectively formed directly atop a dielectric layer in accordance with the present disclosure. The selective deposition of tungsten directly atop a dielectric layer advantageously provides bottom-up gap filling, reducing or eliminating void or seam formation within a feature. Reducing or eliminating voids within a feature reduces resistance, leads to device yield increase, reduces manufacturing costs, and provides an increase in uniformity across a plurality of features during the formation of a semiconductor device. Increased uniformity enhances application of additional process layers as manufacturing continues.

Figure 6:
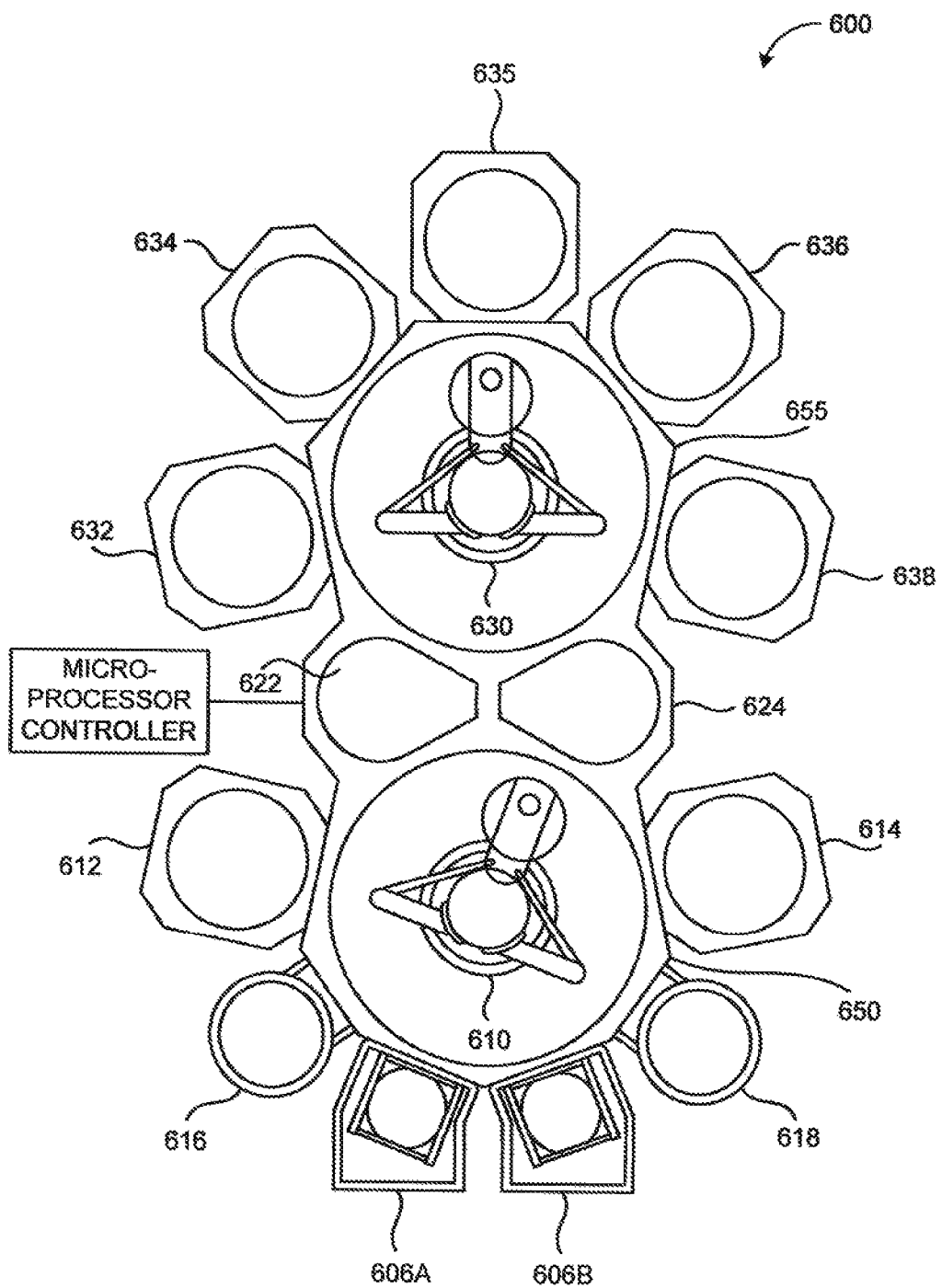
FIG. 6 depicts a cluster tool suitable to perform methods for processing a substrate in accordance with some embodiments of the present disclosure.

FIG. 1 is a flow diagram of a method 100 for selectively depositing a tungsten layer atop a dielectric surface in accordance with some embodiments of the present disclosure. The method 100 is described below with respect to the stages of processing a substrate as depicted in FIGS. 2A-2E. The methods described herein may be performed in individual process chambers such as physical vapor deposition (PVD) chambers or etching chambers that may be provided in a standalone configuration or as part of one or more cluster tools, for example, an integrated tool 600 (i.e., cluster tool) as shown in FIG. 6 or such as those available from Applied Materials, Inc. of Santa Clara, Calif. Other processing chambers, including those available from other manufacturers, may also be adapted to benefit from the present disclosure.

The method 100 is typically performed on a substrate 200 provided to a processing volume of a process chamber. In some embodiments, as shown in FIG. 2A, the substrate 200 includes one or more features such as trench 210, (one shown in FIGS. 2A-E) to be selectively filled in with a tungsten layer 231, the trench 210 extending towards a base 214 of substrate 200. Although the following description is made with respect to one feature, the substrate 200 may include any number of features (such as a plurality of trenches 210, vias, self-aligning vias, self-aligned contact features, duel damascene structures, and the like) as described below or may be suitable for use in a number of process applications such as dual-damascene fabrication processes, self-aligned contact feature processing, and the like. Non-limiting examples of features suitable for etching in accordance with the present disclosure include trenches such as trench 210, vias, and duel-damascene type features.

In embodiments, substrate 200 may be formed of or include one or more of silicon (Si), silicon oxide, such as silicon monoxide (SiO) or silicon dioxide ($SiO_2$), silicon nitride (such as SiN), or the like. In non-limiting embodiments, the substrate 200 may be a trench 210 formed in a dielectric layer, thus the dielectric layer may be substrate 200 or made of the same materials as described above such as SiN, SiO, and the like. In embodiments, a low-k dielectric material may be suitable as a substrate 200 or layer thereof (e.g., a material having a dielectric constant less than silicon oxide, or less than about 3.9), or the like. In addition, the substrate 200 may include additional layers of materials or may have one or more completed or partially completed structures or devices formed in, on or under the substrate 200 (not shown). In embodiments, the substrate 200 or one or more layers thereof may include, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 include a semiconductor wafer. In embodiments, the material of substrate 200 at the bottom of trench 210 is a dielectric material extending across the bottom of the trench 210.

In embodiments, substrate 200 may not be limited to any size or shape. The substrate 200 may be a round wafer having a 200 mm diameter, a 300 mm diameter or other diameters, such as 450 mm, among others. The substrate 200 can also be any polygonal, square, rectangular, curved or otherwise non-circular workpiece, such as a polygonal glass substrate used in the fabrication of flat panel displays.

In some embodiments, features such as trench 210 may be formed by etching the substrate 200 using any suitable etch process. In embodiments, suitable feature(s) for use in accordance with the present disclosure include one or more high aspect depth to width ratio trench(es) having a width of less than 20 nanometers. In some embodiments, the trench 210 is defined by a substrate field 225, a sidewall 220, a dielectric bottom surface 222 of a feature such as trench 210, and upper corner(s) 224 disposed in the substrate 200. In some embodiments, the trench 210 may have a high aspect ratio, e.g., an aspect ratio between about of about 5:1 and about 20:1. As used herein, the aspect ratio is the ratio of a depth of the feature to a width of the feature. In embodiments, the trench 210 has a width as shown by arrow 226 less than or equal to 20 nanometers, less than or equal to 10 nanometers, or a width as shown by arrow 226 between 5 to 10 nanometers.

Figure 2B:
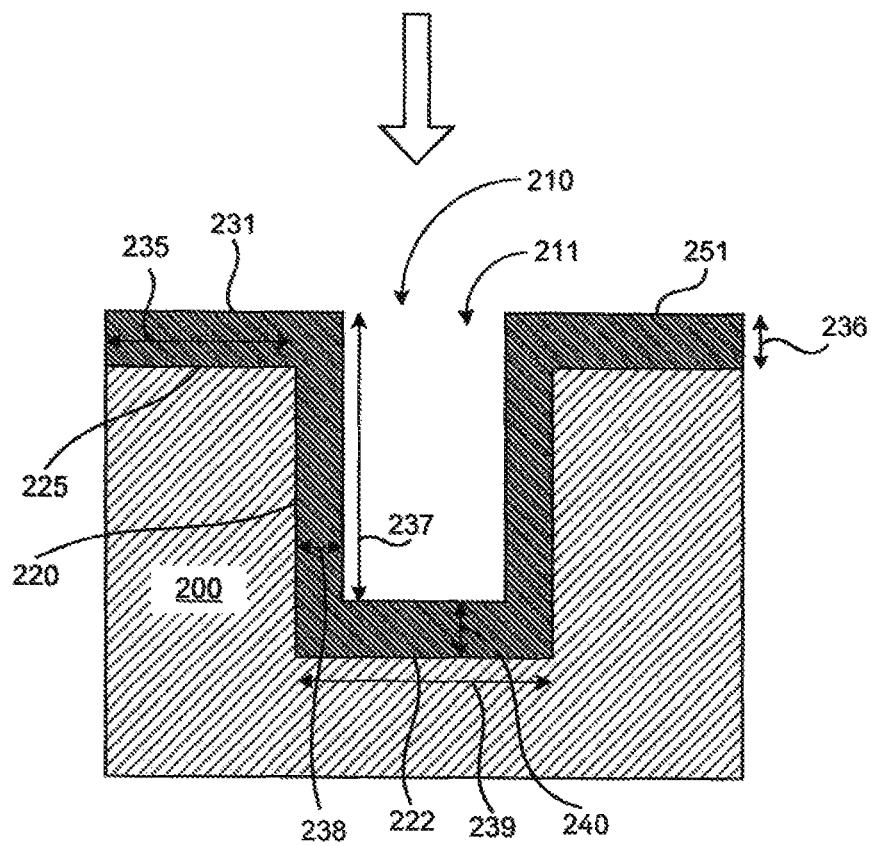

Referring to FIG. 2B, in some embodiments the substrate 200 comprises or consists of a dielectric layer of material described above such as silicon oxide, silicon monoxide (SiO), silicon dioxide (SiO$_2$), silicon nitride (such as SiN), tetraethyl orthosilicate (TEOS), or the like and shaped having an opening 211 in the substrate field 225, a surface opposite the opening 211 such as dielectric bottom surface 222, and a sidewall 220 between the opening 211 and dielectric bottom surface 222, i.e., the surface opposite the opening 211.

Referring now to FIG. 1 at 102, and FIG. 2B, method 100 includes depositing a tungsten layer 231 via a physical vapor deposition (PVD) process atop a substrate field 225, atop sidewall 220, and atop the dielectric bottom surface 222 of a feature such as trench 210 disposed in a substrate 200 to form a first tungsten portion having a first thickness atop the substrate field 225, a second tungsten portion having a second thickness atop the sidewall 220, and a third tungsten portion having a third thickness atop the dielectric bottom surface 222, wherein the second thickness is less than the first thickness and third thickness. For example, in some embodiments, tungsten layer 231 is deposited on substrate 200 and within the feature such as trench 210 in a process chamber configured to PVD deposit tungsten layer 231. In embodiments, the tungsten layer 231 can be a layer non-conformably formed atop the substrate field 225, along the sidewalls 220 and dielectric bottom surface 222 of a feature such as trench 210 and such that a substantial portion of the feature prior to the deposition of the layer remains unfilled after deposition of the layer, wherein a first tungsten portion (shown by arrow 235) having a first thickness (shown as arrow 236) is disposed atop or directly atop the substrate field 225, a second tungsten portion (adjacent to arrow 237) having a second thickness (shown as arrow 238) is disposed atop or directly atop the sidewall 220, and a third tungsten portion (shown above arrow 239) having a third thickness (shown as arrow 240) is disposed atop or directly atop the dielectric bottom surface 222, wherein the second thickness (shown as arrow 238) is less than the first thickness (shown as arrow 236) and third thickness (shown as arrow 240). FIG. 2B is not drawn to scale. FIG. 2B is not drawn to scale and, in embodiments, the first thickness, second thickness and third thickness are not equal.

In some embodiments, the tungsten layer 231 may be formed along the entirety of the sidewall 220, such as two sidewalls, and dielectric bottom surface 222 of the trench 210. In some embodiments, the PVD chamber is configured to deposit a thinner tungsten layer upon the sidewall 220 than the substrate field 225 or dielectric bottom surface 222. For example, in some embodiments, a first tungsten portion (shown as arrow 235) has a first thickness (shown as arrow 236) in the amount of 3 to 6 nm, a second tungsten portion has a second thickness different than the first thickness is disposed atop the sidewall 220, and a third tungsten portion (shown as arrow 240) has a third thickness (shown as arrow 240) in the amount of 3 to 6 nm. In embodiments, the first thickness and third thickness are thicker than the thickness of the second tungsten portion atop the sidewall 220. In embodiments, the second tungsten portion has a second thickness of 0.5 to 1.5 nm, such as about 1 nm. In embodiments, the first thickness is less than the third thickness. In embodiments, the first thickness and the third thickness are each individually greater than the second thickness. In embodiments, the first thickness is about 7 to 9 nm. In embodiments, the second thickness is about 1 to 3 nm. In embodiments, the third thickness is about 9 to 11 nm. In embodiments, the first thickness is about 8 nm, the second thickness is about 2 nm, and the third thickness is about 10 nm.

In some embodiments, the thickness of the tungsten layer 231 is predetermined to fill a gap in a feature such as a trench, via, self-aligned via, duel damascene structure, or the like. In embodiments, the shape of the tungsten layer 231 partially fills the feature from the bottom of the feature adjacent to dielectric bottom surface 222. In embodiments, the feature is only filled about 5 to 25% such as about 10%, 15% or 20% above the dielectric bottom surface 222.

Stiller referring to FIG. 2B, a tungsten layer 231 is shown PVD deposited atop the substrate 200 and within a feature such as trench 210. In embodiments, tungsten layer 231 includes tungsten or a tungsten alloy. In some embodiments, the tungsten layer 231 may also include, however, other metals, tungsten alloys, and dopants, such as nickel, tin, titanium, tantalum, molybdenum, platinum, iron, niobium, palladium, nickel cobalt alloys, doped cobalt, and combinations thereof. In embodiments, the tungsten and tungsten-containing material is substantially pure tungsten, or tungsten with no more than 1, 2, 3, 4, or 5% impurities.

In some embodiments, as shown in FIG. 2B, the tungsten layer 231 is deposited atop a dielectric bottom surface 222 of the substrate 200 and within the trench 210 formed in the substrate 200. The tungsten layer 231 may be deposited using any PVD system available from Applied Materials, Inc. of Santa Clara, Calif. Other suitable PVD process chambers may similarly be used. In some embodiments, suitable process conditions for PVD depositing tungsten layer 231 include process conditions, such as temperature suitable to heat the substrate at a temperature in the range from about 450 degrees Celsius to about 600 degrees Celsius, or in the range from about 450 degrees Celsius to about 500 degrees Celsius. In embodiments, a process chamber for depositing tungsten is maintained at a pressure in the range from about 1 Torr to about 150 Torr, or in the range from about 5 Torr to about 90 Torr.

Referring to FIG. 1 at 104, embodiments of the present disclosure include oxidizing a top surface 251 of the tungsten layer 231 to form a first oxidized tungsten portion 254 atop the substrate field, a second oxidized tungsten portion 256 atop the sidewall 220, and a third oxidized tungsten portion 258 atop the dielectric bottom surface. In embodiments, plasma and oxygen are applied under conditions sufficient to partially convert the tungsten of the first tungsten portion, and third tungsten portion to tungsten oxide (WOx), while entirely converting the second tungsten portion atop sidewall 220 to tungsten oxide. In embodiments, the first tungsten portion (shown as arrow 235 in FIG. 2B) is partially converted to tungsten oxide for example, from the top down across the length of the first tungsten portion, and third tungsten portion (shown as arrow 240 in FIG. 2B)) is partially converted to tungsten oxide for example, from the top down across the length of the first portion, while the second tungsten portion atop the sidewall 220 is entirely converted to tungsten oxide.

In some embodiments, the first tungsten portion (shown as arrow 235), second tungsten portion (adjacent to arrow 237), and third tungsten portion (shown as arrow 239) are each partially or fully oxidized by a radical oxidation process where a sufficient amount of oxygen is provided to the substrate to contact the tungsten portions disposed thereon. In some embodiments, a flux of oxygen is provided in an amount sufficient to oxidize the second tungsten portion (adjacent to arrow 237) atop the sidewall 220 to form tungsten oxide (WOx) on a surface of substrate.

In some embodiments, the first oxidized tungsten portion has a thickness of about 3 to 7 nm. In some embodiments, the second oxidized tungsten portion has a thickness equal to the second thickness or the thickness of the second tungsten portion and may have a thickness such as about 1 to 3 nm. In some embodiments, the third oxidized tungsten portion has a thickness of about 3 to 7 nm, such as about 5, 6, or 7 nm.

In some embodiments, an oxidation process is performed in a process chamber on the substrate 200 having the first tungsten portion (shown as arrow 235), second tungsten portion (adjacent to arrow 237), and third tungsten portion (shown as arrow 239) using oxygen radicals to form the structure shown in FIG. 2C. In embodiments, an oxygen gas, and an argon gas are applied to the substrate. A plasma power is applied to the gases to generate an oxygen radical, etc. The radicals are reacted with the substrate 200 and the first tungsten portion (shown as arrow 235), second tungsten portion (adjacent to arrow 237 in FIG. 2B), and third tungsten portion (shown as arrow 239 in FIG. 2B) to form an oxide layer on the first tungsten portion, second tungsten portion, and third tungsten portion. In some embodiments, the oxidation process may be carried out at an optimally controlled temperature. In embodiments, the oxidation process may be performed at a temperature of about 200° Celsius to about 400° Celsius.

In some embodiments, the substrate 200 having first tungsten portion (shown as arrow 235), second tungsten portion (adjacent to arrow 237), and third tungsten portion (shown as arrow 239) is loaded into a chamber. A pressure and a temperature in the chamber are controlled to stabilize the chamber. An inert gas may be introduced into the chamber to adjust the pressure in the chamber. The chamber has a temperature of about 200° Celsius to about 400° Celsius, or about 250° Celsius to about 280° Celsius. In some embodiments, a plasma power for generating plasma in the chamber is applied into the chamber. In embodiments, the plasma power is within a range of about 1,000 W to about 5,000 W. In some embodiments, a pressure suitable for the oxidation process is provided to the chamber with the plasma power being continuously applied. In some embodiments, the pressure is about 1 mTorr to 100 mTorr. In some embodiments, when the chamber is maintained under the pressure, oxygen gas is introduced into the chamber to perform the primary oxidation process. Additionally, an inert gas such as an argon gas may be introduced into the chamber together with the oxygen gas. In embodiments, argon gas is included and functions to rapidly generate a plasma. In some embodiments, a flux of the oxygen gas is provided in an amount sufficient to entirely oxide all tungsten disposed upon sidewall 220 of the tungsten layer pattern and partially oxidize the first tungsten portion (shown as arrow 235) atop the substrate field 225 and a third tungsten portion (shown as arrow 239) atop the dielectric bottom surface 222 to form tungsten oxide (WOx wherein x equals a number). In embodiments, the first tungsten portion (shown as arrow 235) atop the substrate field 225 and a third tungsten portion (shown as arrow 239) are oxidized from the top down to a depth of between 0.5 to 2.0 nm, or between about 1 to 1.5 nm.

Referring now to process sequence 106 of method 100 and FIGS. 2C and 2D, the present disclosure includes removing the first oxidized tungsten portion (shown below arrow 261), the second oxidized tungsten portion (shown adjacent arrow 263), and the third oxidized tungsten portion (shown adjacent arrow 262), wherein the second oxidized tungsten portion (shown adjacent arrow 263) is completely removed from the sidewall. Accordingly, since all tungsten upon sidewall 220 is oxidized and all the second oxidized tungsten is removed, all tungsten is removed from sidewall 220 as shown in FIG. 2D. In embodiments, referring now to FIG. 2D, after performing the oxidation process, a reduction gas including tungsten hexafluoride ($WF_6$) is introduced in-situ into the chamber to reduce and remove the tungsten oxide (WOx) on the sidewall 220 of the tungsten layer pattern, forming the structure shown in FIG. 2D without the tungsten oxide on the sidewall 220. In some embodiments, tungsten hexafluoride ($WF_6$) is provided in an amount sufficient to soak the structure shown in FIG. 2D and remove all of the tungsten oxide from sidewall 220. As shown in FIG. 2D, at least a portion of the third tungsten portion remains atop the dielectric bottom surface 222, and at least a portion of the first tungsten portion remains atop the substrate field 225. In embodiments, examples of the reduction gas may include hydrogen gas and $NH_3$ gas. In embodiments, hydrogen gas and $NH_3$ gas can be used alone or a mixture thereof. In such embodiments, the reduction gas including $WF_6$ is used alone.

Figure 2E:
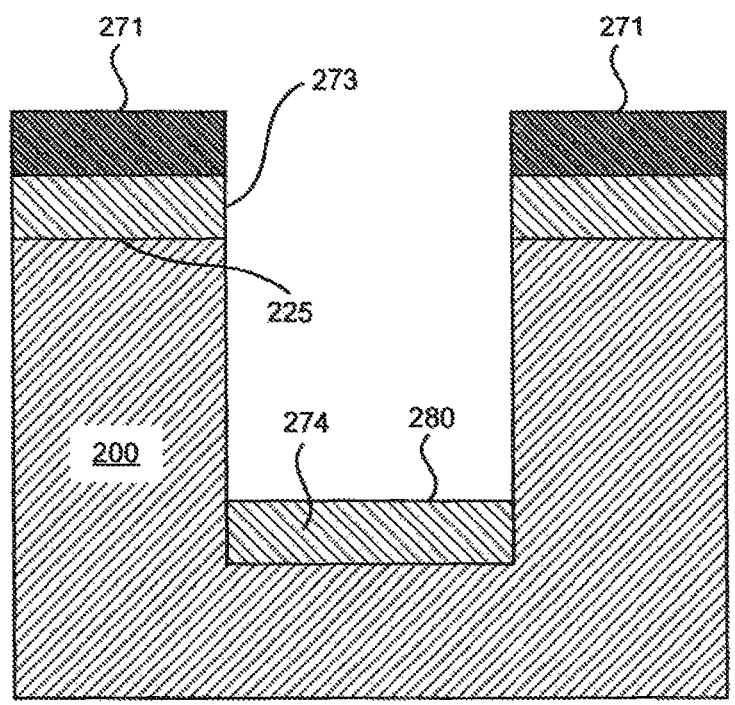

Referring now to process sequence 108 of method 100 and FIG. 2E, the present disclosure includes passivating the first tungsten portion or completely removing the first tungsten portion from the substrate field 225. For example, FIG. 2E depicts passivating the first tungsten portion from the substrate field 225 by forming tungsten nitride layer 271 atop or within the first tungsten portion 273 atop the substrate field 225. In embodiments, tungsten nitride layer 271 is formed by a remote plasma reaction between nitrogen ($N_2$), hydrogen ($H_2$) and argon (Ar) in a process chamber at a first temperature of 300 to 400 degrees Celsius and a pressure of 50 mTorr to 1 Torr. In some embodiments, method 100 includes flowing reaction products from the remote plasma reaction, into the process chamber to selectively form a tungsten nitride layer 271 upon the surface of first tungsten portion 273. In embodiments, the top surface 280 of the third tungsten portion does not contact the remote plasma or reactants of the remote plasma and does not react with nitrogen. In embodiments, a remote plasma reaction reacts nitrogen ($N_2$), and argon (Ar) at a first temperature of 300 to 400 degrees Celsius. In some embodiments, about 65 watts of RF energy is applied to the remote plasma reaction. In embodiments, the tungsten nitride layer 271 is deposited to a predetermined thickness such as about 10 angstroms to about 100 angstroms, or about 100 to about 500 angstroms.

In some embodiments, the nitridation process sequence of process sequence 108 or a direct plasma reaction provides nitrogen at a flow rate of about 5 sccm or less. In embodiments, the pressure of the process chamber during the direct plasma reaction is maintained at 50 mTorr to 1 Torr. In embodiments, RF power is applied during the direct plasma reaction at about 100 watts to 1000 watts. In embodiments, the nitridation process is characterized as a weak nitrogen based plasma that provides little nitrogen to the structure shown in FIG. 2D such that only the top surface of tungsten disposed upon the substrate field 225 will react with the nitrogen plasma. In embodiments, after passivation or removal of the first tungsten portion, only third tungsten portion 274 remains available for selective deposition in downstream processing of substrate 200.

FIGS. 3A-3E respectively depict stages of selectively depositing a tungsten layer atop a dielectric surface in accordance with embodiments of the present disclosure. For example, in some embodiments, the present disclosure relates to a method of selectively depositing a tungsten layer atop a dielectric surface, including: depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; oxidizing a top surface of the tungsten layer to form a first oxidized tungsten portion atop the substrate field, a second oxidized tungsten portion atop the side wall, and a third oxidized tungsten portion atop the dielectric bottom surface; removing the first oxidized tungsten portion, the second oxidized tungsten portion and the third oxidized tungsten portion, wherein the second tungsten portion is completely removed from the sidewall; and removing the first tungsten portion from the substrate field.

FIG. 3A shows substrate 200 including embodiments described above in FIG. 2A. FIG. 3B depicts a PVD deposited tungsten layer 231 atop a substrate field 225, atop sidewall 220, and atop the dielectric bottom surface 222 of a feature such as trench 210 disposed in a substrate 200 to form a first tungsten portion 291 having a first thickness atop the substrate field 225, a second tungsten portion 292 having a second thickness atop the sidewall 220, and a third tungsten portion 293 having a third thickness atop the dielectric bottom surface 222. In embodiments, the second thickness is less than the first thickness and third thickness.

Referring to FIG. 3C, embodiments of the present disclosure include oxidizing a top surface 251 of the tungsten layer 231 to form a first oxidized tungsten portion 254 atop the substrate field, a second oxidized tungsten portion 256 atop the sidewall 220, and a third oxidized tungsten portion 258 atop the dielectric bottom surface or tungsten deposited atop the dielectric bottom surface. In embodiments, plasma and oxygen are applied under conditions sufficient to partially convert the tungsten of the first tungsten portion, and third tungsten portion to tungsten oxide, while entirely converting the tungsten portion atop sidewall 220 to tungsten oxide. In embodiments, the first tungsten portion is converted more to tungsten oxide than the third tungsten portion. In embodiments, the present disclosure includes preselecting or tuning the thickness of the first oxidized tungsten portion 254, while limiting the thickness of third oxidized tungsten portion 258 atop the dielectric bottom surface 222 or tungsten 299 deposited atop the dielectric bottom surface 222.

In some embodiments, the degree or thickness of tungsten oxidation may be controlled by the dissociation and plasma characteristics to tailor the tungsten oxidation to provide improved etching performance. For example, in some embodiments, including a reduced power capacitively-coupled plasma (CCP) within a process chamber including substrate 200, the chamber degradation can be reduced, which provides improved process. Accordingly, the systems described herein provide improved flexibility in terms of chemistry modulation, while also providing improved etching performance. In embodiments, non-limiting process chambers suitable for etching in accordance with the present disclosure are shown and described in U.S. Pat. No. 9,362,130 granted on Jun. 7, 2016 entitled Enhanced Etching Processes Using Remote Plasma Sources to Ingle et al. and assigned to Applied Materials, Inc. In some embodiments, a processing chamber for use herein is coupled to a remote plasma source which provides gaseous treatment radicals to a processing volume. Typically, the remote plasma source (RPS) includes a capacitively coupled plasma (CCP) source. In some embodiments, the remote plasma source is a stand-alone RPS unit. In other embodiments, the remote plasma source is a second processing chamber in fluid communication with a processing chamber including substrate 200.

In some embodiments, a remote plasma region in a processing chamber such as an etch chamber may be configured for a capacitively-coupled plasma ("CCP") formed within a region of the processing chamber. In embodiments, plasma configurations in the remote plasma region may be located fluidly between e.g. another remote plasma region and a processing region. In some embodiments, a remote plasma region may be defined by two or more electrodes that allow a plasma to be formed within the region. In some embodiments, the CCP may be operated at reduced or substantially reduced power because the CCP may be utilized only to maintain the oxygen-containing plasma effluents, and not to fully ionize species within the plasma region. For example, the CCP may be operated at a power level below or about 400 W, 250 W, 200 W, 150 W, 100 W, 50 W, 20 W, etc. or less. Moreover, the CCP may produce a flat plasma profile which may provide a uniform plasma distribution within the space. As such, a more uniform plasma may be delivered to the first tungsten portion 291, a second tungsten portion 292, without reaching the third tungsten portion 293. Accordingly, the first tungsten portion 291 may be more oxidized or have a thicker layer of tungsten oxide formed therein as compared to the third tungsten portion 293. In embodiments, the second tungsten portion 292 is thin, thus is entirely converted to tungsten oxide.

In some embodiments, an oxygen containing plasma such as the CCP may be delivered at a power of less than 400 W, for example 350 W to 375 W. In some embodiments, a CCP oxygen containing plasma may be delivered at a temperature of about 300 degrees Celsius to about 400 degrees Celsius. In some embodiments, an CCP oxygen containing plasma may be delivered at a temperature of about 300 degrees Celsius to about 400 degrees Celsius. In some embodiments, a CCP oxygen containing plasma may be delivered wherein oxygen is provided at a flow rate of less than 50 sccm, such as 30 to 45 sccm. In embodiments, a CCP oxygen containing plasma may be delivered for less than 60 seconds, less than 30 seconds, or between 10 to 25 seconds.

Referring to FIG. 3D, the present disclosure includes removing the first oxidized tungsten portion 254, the second oxidized tungsten portion 256 and the third oxidized tungsten portion 258, wherein the second tungsten portion 292 is completely removed from the sidewall 220. In embodiments, the tungsten oxide is contacted and soaked in tungsten hexafluoride ($WF_6$) as described above. For example, referring now to FIG. 3D, after performing an oxidation process, a reduction gas including tungsten hexafluoride ($WF_6$) is introduced in-situ into a process chamber including substrate 200 to reduce and remove the tungsten oxide (WOx) on the sidewall 220 of the tungsten layer pattern, forming the structure shown in FIG. 3D without the tungsten oxide on the sidewall 220. In some embodiments, tungsten hexafluoride ($WF_6$) is provided in an amount sufficient to soak the structure shown in FIG. 3D and remove all of the tungsten oxide from sidewalk 220. In some embodiments, as shown by arrows 297 and 298, the process sequences of (a) oxidizing a top surface of the tungsten layer to form a first oxidized tungsten portion atop the substrate field, a second oxidized tungsten portion atop the side wall, and a third oxidized tungsten portion atop the dielectric bottom surface and (b) removing the first oxidized tungsten portion, the second oxidized tungsten portion and the third oxidized tungsten portion, wherein the second tungsten portion is completely removed from the sidewall may be cycled in order to tailor the oxidation and removal of tungsten. In embodiments, process sequences (a) and (b) may be cycled in a number of cycles sufficient to remove all of the first tungsten portion 291 and form the structure shown in FIG. 3E, where only the third tungsten portion 293 remains deposited atop or directly atop dielectric material of substrate 200. In embodiments, the process sequences (a) and (b) may be cycled between 1-10 times, or 1-5 times, to remove the first tungsten portion 291 and form the structure shown in FIG. 3E.

FIG. 7 is a flow diagram of a method 700 for selectively depositing a tungsten layer atop a dielectric surface in accordance with some embodiments of the present disclosure. The method 700 is described below with respect to the stages of processing a substrate as depicted in FIGS. 4A-4D. The methods described herein may be performed in individual process chambers such as physical vapor deposition (PVD) chambers or etching chambers that may be provided in a standalone configuration or as part of one or more cluster tools, for example, an integrated tool 600 (i.e., cluster tool) as shown in FIG. 6 or such as those available from Applied Materials, Inc. of Santa Clara, Calif. Other processing chambers, including those available from other manufacturers, may also be adapted to benefit from the present disclosure.

FIGS. 4A-4D respectively depict stages of selectively depositing a tungsten layer atop a dielectric surface in accordance with embodiments of the present disclosure. For example, in some embodiments, the present disclosure relates to a method of selectively depositing a tungsten layer atop a dielectric surface, including: as shown at process sequence 702, depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and, as shown at process sequence 704, removing the first tungsten portion, and the second tungsten portion, wherein the first tungsten portion and second tungsten portion are completely removed from the substrate, and wherein the third tungsten portion remains atop the dielectric bottom surface.

Figure 4A:
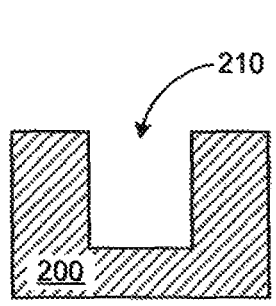
FIGS. 4A-4D respectively depict stages of selectively depositing a tungsten layer atop a dielectric surface in accordance with embodiments of the present disclosure.
Figure 4B:
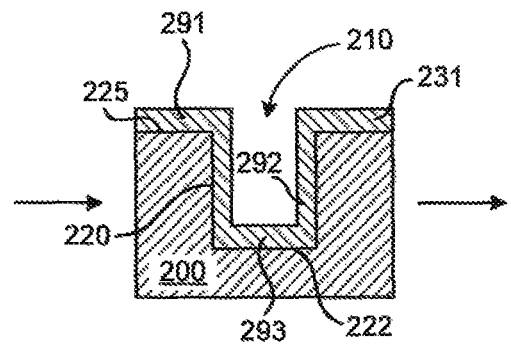

FIG. 4A shows substrate 200 including embodiments described above in FIG. 2A. FIG. 4B depicts a PVD deposited tungsten layer 231 atop a substrate field 225, atop sidewall 220, and atop the dielectric bottom surface 222 of a feature such as trench 210 disposed in a substrate 200 to form a first tungsten portion 291 having a first thickness atop the substrate field 225, a second tungsten portion 292 having a second thickness atop the sidewall 220, and a third tungsten portion 293 having a third thickness atop the dielectric bottom surface 222. In embodiments, the second thickness is less than the first thickness and third thickness. The PVD reaction conditions and thicknesses such as the first thickness, second thickness and third thickness may be the same as those described above.

Figure 4C:
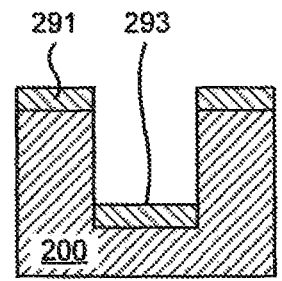

Referring to FIGS. 4B and 4C, embodiments of the present disclosure include removing the first tungsten portion 291, and the second tungsten portion 292, wherein the second tungsten portion 292 is completely removed from the sidewall 220. In some embodiments, a tungsten etch back of the first tungsten portion 291, and the second tungsten portion 292 is achieved by using a tungsten halide plasma (e.g., $WF_6$ plasma) and contacting the first tungsten portion 291, and the second tungsten portion 292 with the tungsten halide plasma under conditions sufficient to etch or remove the partially, or wholly the first tungsten portion 291, and the second tungsten portion 292. In embodiments, substrate 200 is disposed within a processing chamber including a suitable plasma source such as a radio frequency (RF) or a remote plasma source (RPS). In some embodiments, atomic fluorine is dissociated from the $WF_6$ plasma and the atomic fluorine is used to etch the metal tungsten of at least the first tungsten portion 291 and the second tungsten portion 292. In embodiments, the etch rate depends on the $WF_6$ flow and plasma conditions. By adjusting the process conditions, a very moderate etch rate in the range of 0.5 angstrom/sec to 3 angstrom/sec can be achieved to control the amount of etch back. In embodiments, a single chamber deposition-etch-deposition process can be achieved since $WF_6$ can be used as both a deposition precursor and an etchant in a chamber. Standard PVD chambers with RF or RPS plasma capabilities can perform both deposition and etch back, thus providing improved throughput and chamber redundancy.

In some embodiments, the first tungsten portion 291, and the second tungsten portion 292 are etched using tungsten-containing gas to remove portions of the first tungsten portion 291, and the second tungsten portion 292. An etch process (also known as an etch back process) removes portions of the first tungsten portion 291, and the second tungsten portion 292 along sidewalls 220. The etching process can also be performed in a processing chamber that is the same as the tungsten deposition process. In embodiments, a plasma can be formed by coupling radio frequency (RF) power to a process gas such as helium (He), argon (Ar), oxygen ($O_2$), nitrogen ($N_2$), or a combination of the above. The plasma can be formed by a remote plasma source (RPS) and delivered to a processing chamber.

In embodiments, the temperature of substrate 200 may range from about 100 degrees Celsius to about 600 degrees Celsius during the etching process (e.g., in the range of about 300 degrees Celsius to 430 degrees Celsius). In embodiments, the etching of the first tungsten portion 291, and the second tungsten portion 292 may be performed where the pressure of the processing chamber is in the range of about 0.1 Torr to about 5 Torr (for example, in the range of about 0.5 Torr to about 2 Torr). In one example, the pressure may be approximately 1 Torr. In embodiments, a process gas (e.g., argon (Ar)) can be introduced at a flow rate in the range of from about 100 sccm to about 3,000 sccm. In one example, argon can be introduced at a total flow rate of 2,000 sccm. In embodiments, the tungsten-containing compound for etching may be tungsten hexafluoride ($WF_6$) and may be introduced at a continuous flow rate in the range of about 1 sccm to 150 sccm, such as in the range of about 3 sccm to 100 sccm.

Figure 4D:
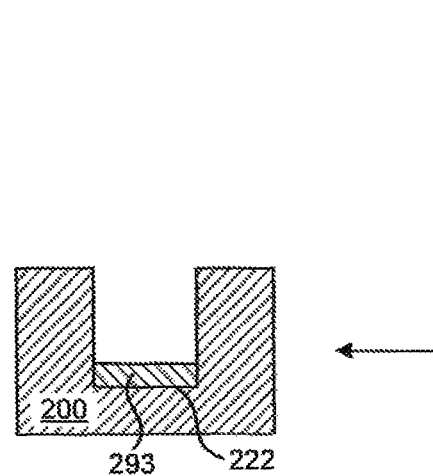

In embodiments, after the etch back as described herein, subsequent to removing first tungsten portion 291, and the second tungsten portion 292 or portions thereof, the substrate 200 may be further processed to form the structure as shown in FIG. 4D. For example, in some embodiments, tungsten hexafluoride ($WF_6$) is provided in an amount sufficient to soak the structure shown in FIG. 4C and remove all of the tungsten oxide from sidewall 220. As shown in FIGS. 4C and 4D, at least a portion of the third tungsten portion 293 remains atop the dielectric bottom surface 222, and no tungsten remains atop the substrate field 225 and sidewall 220. In embodiments, examples of the reduction gas may include hydrogen gas and $NH_3$ gas. In embodiments, hydrogen gas and $NH_3$ gas can be used alone or a mixture thereof. In such embodiments, the reduction gas including $WF_6$ is used alone.

FIGS. 5A-5E respectively depict stages of selectively depositing a tungsten layer atop a dielectric surface in accordance with embodiments of the present disclosure. For example, in some embodiments, the present disclosure relates to a method of selectively depositing a tungsten layer atop a dielectric surface, including: depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; oxidizing a top surface of the tungsten layer to form a first oxidized tungsten portion atop the substrate field, a second oxidized tungsten portion atop the side wall, and a third oxidized tungsten portion atop the dielectric bottom surface; removing the first oxidized tungsten portion, the second oxidized tungsten portion and the third oxidized tungsten portion, wherein the second tungsten portion is completely removed from the sidewall; and removing the first tungsten portion from the substrate field.

Figure 5A:
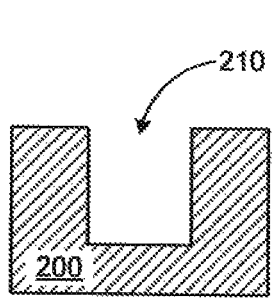
FIGS. 5A-5E respectively depict stages of selectively depositing a tungsten layer atop a dielectric surface in accordance with embodiments of the present disclosure.
Figure 5B:
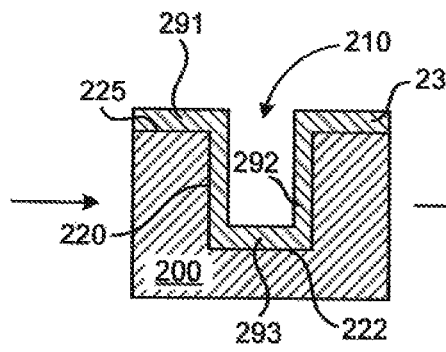

FIG. 5A shows substrate 200 including embodiments described above in FIG. 2A. FIG. 5B depicts a PVD deposited tungsten layer 231 atop a substrate field 225, atop sidewall 220, and atop the dielectric bottom surface 222 of a feature such as trench 210 disposed in a substrate 200 to form a first tungsten portion 291 having a first thickness atop the substrate field 225, a second tungsten portion 292 having a second thickness atop the sidewall 220, and a third tungsten portion 293 having a third thickness atop the dielectric bottom surface 222. In embodiments, the second thickness is less than the first thickness and third thickness.

In embodiments, the PVD chamber is a chamber as disclosed in U.S. Pat. No. 9,062,372 entitled Self-Ionized and Capacitively-Coupled Plasma For Sputtering and Resputtering to Gopalraja et al. and assigned to Applied Materials. In embodiments, a suitable process chamber sputter configured for depositing tungsten by self-ionized plasma (SIP) sputtering.

In embodiments, the PVD deposition is performed by sputter depositing tungsten by self-ionized plasma (SIP) sputtering. In embodiments, a magnetic field generated by an electromagnetic coil confines the plasma generated by capacitive coupling to increase the plasma density and hence the ionization rate. Long-throw sputtering is characterized by a relatively high ratio of the target-to-substrate distance to the substrate diameter. Long-throw SIP sputtering promotes deep hole coating of both the ionized and neutral deposition material components. CCP resputtering can reduce the thickness of layer bottom coverage of deep holes to reduce contact resistance.

In embodiments, SIP tends to be promoted by low pressures of less than 5 mTorr. SIP, particularly at low pressure, tends to be promoted by magnetrons having relatively small areas causing increased target power density, and by magnetrons having asymmetric magnets causing the magnetic field to penetrate farther toward the substrate. According to one aspect of the disclosure, plasma conditions are provided for SIP sputtering to deposit target material.

In embodiments, a reactor is provided including a DC magnetron type reactor based on a modification of the Endura PVD Reactor available from Applied Materials, Inc. of Santa Clara, Calif. In embodiments the reactor is capable of self-ionized sputtering (SIP) in a long-throw mode. A SIP mode may be used in one embodiment in which nonuniform coverage is desired, such as coverage primarily directed to the sidewalls of the hole. The SIP mode may be used to achieve more uniform coverage also. In yet another alternative embodiment, the pressure in the chamber may be changed from one step to the next. For example, pressure may be raised during SIP sputtering.

To attract the ions generated by the plasma, a tungsten target may be negatively biased by a variable DC power source at a DC power of 1-40 kW, for example. The source negatively biases the target to about −400 to −600 VDC with respect to a chamber shield to ignite and maintain the plasma. A voltage less than −1000 VDC is generally suitable for use herein. A target power of between 1 and 5 kW is typically used to ignite the plasma while a power of greater than 10 kW is suitable for the SIP sputtering described here. For example, a target power of 24 kW may be used to deposit tungsten by SIP sputtering.

In embodiments, a source may apply RF power to a pedestal electrode to bias the substrate to attract deposition material ions during SIP sputter deposition. During SIP deposition, the pedestal and hence the substrate 200 may be left electrically floating, but a negative DC self-bias may nonetheless develop on pedestal and hence the substrate 200. Alternatively, the pedestal may be negatively biased by a source at −30 VDC to negatively bias the substrate to attract the ionized deposition material to the substrate.

In some embodiments, when the argon is admitted into a PVD processing chamber, a DC voltage difference between the target, such as a tungsten target, and a chamber shield may ignite the argon into a plasma, and positively charged argon ions are attracted to a negatively charged target. The ions strike the target at a substantial energy and cause target atoms or atomic clusters to be sputtered from the target. Some of the target particles strike the substrate 200 and are deposited on substrate 200, forming a PVD deposited layer of tungsten material such as shown in FIG. 5B. In reactive sputtering of a tungsten material, the tungsten is deposited to form a first tungsten portion 291 having a first thickness atop the substrate field 225, a second tungsten portion 292 having a second thickness atop the sidewall 220, and a third tungsten portion 293 having a third thickness atop the dielectric bottom surface 222. In embodiments, the second thickness is less than the first thickness and third thickness. In embodiments, the third thickness is thicker than the first thickness and the second thickness. In some embodiments, the first thickness is about 7 to 9 nm. In some embodiments, the second thickness is about 1 to 3 nm. In some embodiments, the third thickness is about 9 to 11 nm. In some embodiments, the first thickness is about 8 nm, the second thickness is about 2 nm, and the third thickness is about 10 nm.

Figure 5C:
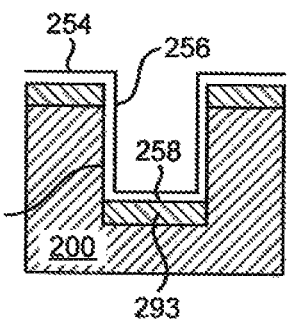

Referring to FIG. 5C, embodiments of the present disclosure include oxidizing a top surface 251 of the tungsten layer 231 or the top surface the first tungsten portion 291 having a first thickness, the top surface of the second tungsten portion 292 having a second thickness atop the sidewall 220, and the top surface of the third tungsten portion 293 to form a first oxidized tungsten portion 254 atop the substrate field, a second oxidized tungsten portion 256 atop the sidewall 220, and a third oxidized tungsten portion 258 atop the dielectric bottom surface or tungsten deposited atop the dielectric bottom surface. In embodiments, plasma and oxygen are applied under conditions sufficient to partially convert the tungsten of the first portion, and third portion to tungsten oxide, while entirely converting the tungsten atop sidewall 220 to tungsten oxide. In embodiments, the first tungsten portion is converted more to tungsten oxide than the third tungsten portion. In embodiments, the present disclosure includes preselecting or tuning the thickness of the first oxidized tungsten portion 254, while limiting the thickness of third oxidized tungsten portion 258 atop the dielectric bottom surface or tungsten deposited atop the dielectric bottom surface.

Figure 5E:
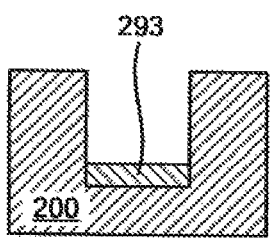
Figure 5D:
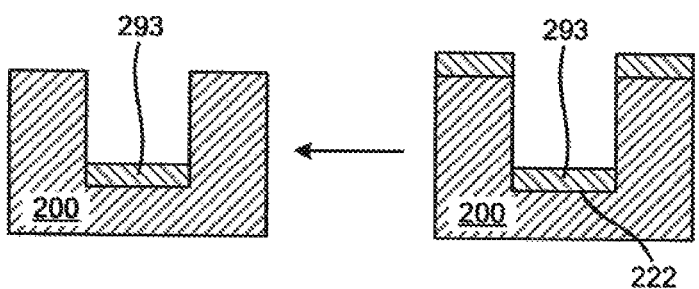

In embodiments, after forming a first oxidized tungsten portion 254 atop the substrate field, a second oxidized tungsten portion 256 atop the sidewall 220, and a third oxidized tungsten portion 258 atop the dielectric bottom surface or tungsten deposited atop the dielectric bottom the substrate 200 may be further processed to form the structure as shown in FIG. 5E. For example, in some embodiments, tungsten hexafluoride ($WF_6$) is provided in an amount sufficient to soak the structure shown in FIG. 5C and remove all of the tungsten oxide from sidewall 220. As shown in FIGS. 5C and 5D, at least a portion of the third tungsten portion 293 remains atop the dielectric bottom surface 222. After further etching, and as shown in FIG. 5E, no tungsten remains atop the substrate field 225 and sidewall 220. In embodiments, examples of the reduction gas may include hydrogen gas and $NH_3$ gas. In embodiments, hydrogen gas and $NH_3$ gas can be used alone or a mixture thereof. In such embodiments, the reduction gas including $WF_6$ is used alone.

The tungsten-containing layer exhibits utility when the tungsten layer as described above is integrated with conventional filling techniques to form features having excellent film properties. The integration scheme may include physical vapor deposition (PVD), and plasma enhancement for depositing a tungsten layer. Etching chambers are also suitable for use herein. Integrated processing systems capable of performing the integrated methods disclosed herein include ENDURA®, ENDURA® SL, CENTURA®, or PRODUCER® processing systems, each available from Applied Materials, Inc., located in Santa Clara, Calif. In one implementation, a physical vapor deposition (PVD) and etching chamber may be provided to perform all vapor deposition and etching processes associated with the tungsten layer atop the dielectric layer.

Referring now to FIG. 6, the methods described herein may be performed in individual process chambers that may be provided in a standalone configuration or as part of one or more cluster tools, for example, an integrated tool 600 (i.e., cluster tool) described below with respect to FIG. 6. In embodiments, a cluster tool is configured for performing the methods such as method 100 for selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the side wall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field.

In embodiments, the cluster tool may be configured to include additional chambers. Non-limiting examples of an additional chamber for selective metal deposition includes the VOLTA® brand processing chamber available from Applied Materials, Inc., of Santa Clara, Calif. Examples of the integrated tool 600 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks while processing.

In embodiments, the integrated tool 600 can include two load lock chambers 606A, 606B for transferring of substrates into and out of the integrated tool 600. Typically, since the integrated tool 600 is under vacuum, the load lock chambers 606A, 606B may "pump down" the substrates introduced into the integrated tool 600. A first robot 410 may transfer the substrates between the load lock chambers 606A, 606B, and a first set of one or more substrate processing chambers 612, 614, 616, 618 (four are shown) coupled to a first central transfer chamber 650. Each substrate processing chamber 612, 614, 616, 618, can be outfitted to perform a number of substrate processing operations. In some embodiments, the first set of one or more substrate processing chambers 612, 614, 616, 618 may include any combination of PVD, etch, ALD, CVD, or degas chambers. For example, in some embodiments, the substrate processing chambers 612, and 614 include a process chamber suitable for PVD deposition, configured to deposit tungsten atop a substrate as described above.

In some embodiments, the first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 630 can transfer the substrates between the intermediate transfer chambers 622, 624 and a second set of one or more substrate processing chambers 632, 634, 635, 636, 638 coupled to a second central transfer chamber 655. The substrate processing chambers 632, 634, 635, 636, 638 can be outfitted to perform a variety of substrate processing operations including the methods 300, 400 described above in addition to, physical vapor deposition processes (PVD), chemical vapor deposition (CVD), selective metal deposition, etching, orientation and other substrate processes. Any of the substrate processing chambers 612, 614, 616, 618, 632, 634, 635, 636, 638 may be removed from the integrated tool 600 if not necessary for a particular process to be performed by the integrated tool 600. In embodiments, the microprocessor includes memory such as and non-transitory computer readable medium having instructions stored thereon that, when executed, cause an integrated tool or reaction chamber to perform selectively depositing a tungsten layer atop a dielectric surface in accordance with the present disclosure.

In some embodiments, the present disclosure relates to a non-transitory computer readable medium having instructions stored thereon that, when executed, cause a reaction chamber to perform selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the side wall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field.

In some embodiments, the present disclosure relates to a non-transitory computer readable medium having instructions stored thereon that, when executed, cause a reaction chamber to perform selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten, wherein the second tungsten portion is completely removed from the sidewall; and wherein the third tungsten portion remain atop dielectric bottom surface.

In some embodiments, the present disclosure relates to a method of selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the sidewall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field. In embodiments, (a), (b), (c), and (d) are performed sequentially. In embodiments, (b) and (c) are cyclically repeated in cycles sufficient to remove the first tungsten portion from the field of the substrate, and wherein the third oxidized remains atop the dielectric bottom surface. In some embodiments, depositing includes forming a first thickness and a third thickness that are greater than the second thickness. In embodiments, oxidizing is characterized as conformal or super-conformal. In embodiments, the oxidizing includes contacting the top surface of the tungsten layer with oxygen plasma. In embodiments, removing comprises contacting the first oxidized tungsten portion, the second oxidized tungsten portion and the third oxidized tungsten portion with $WF_6$ under conditions sufficient to remove the second oxidized tungsten portion from the sidewall. In embodiments, passivating includes contacting the first tungsten portion with remote nitrogen plasma at a temperature of about 300 to about 400 degrees Celsius, a pressure of about 500 mTorr to about 1 Torr, wherein nitrogen is provided at a flow rate of about 0.5 to 5 sccm, or below 5 sccm. In some embodiments, oxidizing further includes providing a capacitively-coupled plasma comprising oxygen at a temperature of about 300 degrees Celsius to about 400 degrees Celsius.

In some embodiments, a method of selectively depositing a tungsten layer atop a dielectric surface, includes: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten, wherein the second tungsten portion is completely removed from the sidewall; and wherein the third tungsten portion remain atop dielectric bottom surface. In some embodiments, depositing comprising forming a first thickness and a third thickness that are greater than the second thickness. In embodiments, removing further comprises contacting a substrate with $WF_6$ under conditions sufficient to remove the tungsten from the sidewall.

In some embodiments, the present disclosure relates to a method of selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; (b) oxidizing a top surface of the tungsten layer to form a first oxidized tungsten portion atop the substrate field, a second oxidized tungsten portion atop the sidewall, and a third oxidized tungsten portion atop the dielectric bottom surface; (c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field. In some embodiments, the first thickness is about 7 to 9 nm, the second thickness is about 1 to 3 nm, and the third thickness is about 9 to 11 nm. In some embodiments, depositing comprising forming a first thickness and a third thickness that are greater than the second thickness. In some embodiments, In embodiments, the first thickness is about 8 nm, the second thickness is about 2 nm, and the third thickness is about 10 nm. In some embodiments, the first oxidized tungsten portion has a thickness of about 3 to 7 nm. In some embodiments, the second oxidized tungsten portion has a thickness equal to the second thickness or the thickness of the second tungsten portion and may have a thickness such as about 1 to 3 nm. In some embodiments, the third oxidized tungsten portion has a thickness of about 3 to 7 nm, such as about 5, 6, or 7 nm.

In some embodiments, the present disclosure relates to a method of selectively depositing a tungsten layer atop a dielectric surface, including: (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten portion, wherein the first tungsten portion and second tungsten portion are completely removed from the substrate, and wherein the third tungsten portion remains atop the dielectric bottom surface. In embodiments, the first thickness is less than the third thickness. In embodiments, depositing further comprises forming the first thickness less than the third thickness. In embodiments, depositing further comprises forming a first thickness and a third thickness that are greater than the second thickness. In embodiments, the first thickness is about 7 to 9 nm. In embodiments, the second thickness is about 1 to 3 nm. In embodiments, the third thickness is about 9 to 11 nm. In embodiments, the first thickness is about 8 nm, the second thickness is about 2 nm, and the third thickness is about 10 nm.

While the foregoing is directed to embodiments of the present disclosure, other and further embodiments of the disclosure may be devised without departing from the basic scope thereof.

The invention claimed is:

1. A method of selectively depositing a tungsten layer atop a dielectric surface, comprising:
   (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness;
   (b) oxidizing a top surface of the tungsten layer to form a first oxidized tungsten portion atop the substrate field, a second oxidized tungsten portion atop the sidewall, and a third oxidized tungsten portion atop the dielectric bottom surface;
   (c) removing the first oxidized tungsten portion, the second oxidized tungsten portion and the third oxidized tungsten portion, wherein the second tungsten portion is completely removed from the sidewall; and
   (d) passivating or completely removing the first tungsten portion from the substrate field.

2. The method of claim 1, wherein the first thickness is about 7 to 9 nm, the second thickness is about 1 to 3 nm, and the third thickness is about 9 to 11 nm.

3. The method of claim 1, wherein depositing comprising forming a first thickness and a third thickness that are greater than the second thickness.

4. The method of claim 1, wherein oxidizing is characterized as conformal or super-conformal.

5. The method of claim 1, wherein the oxidizing comprises contacting the top surface of the tungsten layer with oxygen plasma.

6. The method of claim 1, wherein removing comprises contacting the first oxidized tungsten portion, the second oxidized tungsten portion and the third oxidized tungsten portion with $WF_6$ under conditions sufficient to remove the second oxidized tungsten portion from the sidewall.

7. The method of claim 1, wherein (b) and (c) are cyclically repeated in cycles sufficient to remove the first tungsten portion from the substrate field, and wherein the third oxidized tungsten portion remains atop the dielectric bottom surface.

8. The method of claim 1, wherein passivating comprises contacting the first tungsten portion with remote nitrogen plasma at a temperature of about 300 to about 400 degrees Celsius wherein nitrogen is provided at a flow rate of about 0.5 to 5 sccm, or below 5 sccm.

9. The method of claim 1, wherein passivating comprises contacting the first tungsten portion with remote nitrogen plasma at a pressure of about 500 mTorr to about 1 Torr, wherein nitrogen is provided at a flow rate of about 0.5 to 5 sccm, or below 5 sccm.

10. The method of claim 1, wherein (a), (b), (c), and (d) are performed sequentially.

11. The method of claim 1, wherein (b) oxidizing further comprises providing a capacitively-coupled plasma comprising oxygen at a temperature of about 300 degrees Celsius to about 400 degrees Celsius.

12. A method of selectively depositing a tungsten layer atop a dielectric surface, comprising:
   (a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness; and (b) removing the first tungsten portion, and the second tungsten portion, wherein the first tungsten portion and second tungsten portion are completely removed from the substrate, and wherein the third tungsten portion remains atop the dielectric bottom surface.

13. The method of claim 12, wherein the first thickness is less than the third thickness.

14. The method of claim 12, wherein depositing further comprises forming the first thickness less than the third thickness.

15. The method of claim 12, wherein depositing further comprises forming a first thickness and a third thickness that are greater than the second thickness.

16. The method of claim 12, wherein the first thickness is about 7 to 9 nm.

17. The method of claim 12, wherein the second thickness is about 1 to 3 nm.

18. The method of claim 12, wherein the third thickness is about 9 to 11 nm.

19. The method of claim 12, wherein the first thickness is about 8 nm, the second thickness is about 2 nm, and the third thickness is about 10 nm.

20. A non-transitory computer readable medium having instructions stored thereon that, when executed, cause a reaction chamber to perform selectively depositing a tungsten layer atop a dielectric surface, comprising:

(a) depositing a tungsten layer via a physical vapor deposition (PVD) process atop a substrate field and atop a sidewall and a dielectric bottom surface of a feature disposed in a substrate to form a first tungsten portion having a first thickness atop the substrate field, a second tungsten portion having a second thickness atop the sidewall, and a third tungsten portion having a third thickness atop the dielectric bottom surface, wherein the second thickness is less than the first thickness and third thickness;

(b) oxidizing a top surface of the tungsten layer to form a first oxidized tungsten portion atop the substrate field, a second oxidized tungsten portion atop the sidewall, and a third oxidized tungsten portion atop the dielectric bottom surface;

(c) removing the first oxidized tungsten portion, the second oxidized tungsten portion and the third oxidized tungsten portion, wherein the second tungsten portion is completely removed from the sidewall; and (d) passivating or completely removing the first tungsten portion from the substrate field.

\* \* \* \* \*